(12) United States Patent
Sato et al.

(10) Patent No.: US 7,672,349 B2
(45) Date of Patent: Mar. 2, 2010

(54) LASER DIODE

(75) Inventors: Keiji Sato, Miyagi (JP); Ryuichiro Hayashi, Miyagi (JP); Kenji Oikawa, Miyagi (JP); Takeharu Asano, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/462,726

(22) Filed: Aug. 7, 2006

(65) Prior Publication Data

US 2007/0030872 A1    Feb. 8, 2007

(30) Foreign Application Priority Data

Aug. 8, 2005    (JP)    ............................ P2005-229321

(51) Int. Cl.
*H01S 5/00*    (2006.01)
(52) U.S. Cl. ............... 372/50.1; 372/43.01; 372/50.121
(58) Field of Classification Search ................ 372/50.1, 372/50.121, 50.122
See application file for complete search history.

(56) References Cited

U.S. PATENT DOCUMENTS

| | | | |
|---|---|---|---|
| 4,901,325 A | 2/1990 | Kato et al. | |
| 5,311,536 A | 5/1994 | Paoli et al. | |
| 5,402,436 A | 3/1995 | Paoli | |
| 5,636,235 A | 6/1997 | Miyazaki | |
| 5,638,391 A * | 6/1997 | Shima et al. | ........... 372/44.011 |
| 5,638,393 A | 6/1997 | Kovacs | |
| 5,644,586 A | 7/1997 | Kawano et al. | |
| 5,920,766 A | 7/1999 | Floyd | |
| 6,136,623 A * | 10/2000 | Hofstetter et al. | .............. 438/28 |
| 6,771,586 B2 * | 8/2004 | Fujii | .......................... 369/121 |
| 6,956,322 B2 | 10/2005 | Ikeda | |
| 2003/0027478 A1* | 2/2003 | Park et al. | ...................... 445/24 |
| 2004/0184502 A1* | 9/2004 | Miyachi et al. | ................ 372/50 |

FOREIGN PATENT DOCUMENTS

| | | |
|---|---|---|
| JP | 63-237490 | 10/1988 |
| JP | 64-67992 | 3/1989 |
| JP | 64-70936 | 3/1989 |
| JP | 7-211991 | 8/1995 |

(Continued)

OTHER PUBLICATIONS

Chinese Office Action issued on Sep. 19, 2008 in connection with CN Application No. 2006-10159248.8.

(Continued)

*Primary Examiner*—Dung T Nguyen
(74) *Attorney, Agent, or Firm*—Sonnenschein Nath & Rosenthal LLP

(57) ABSTRACT

A laser diode which can be easily assembled at low material cost is provided. A first light emitting device having a laser structure on a substrate, a second light emitting device having laser structures on a substrate, and a support base are provided. The first light emitting device and the second light emitting device are layered in this order on the support base in a manner that the respective laser structures of the first light emitting device and the second light emitting device are opposed to each other. A substrate side of the first light emitting device and a laser structure side of the second light emitting device are electrically connected to the support base.

13 Claims, 11 Drawing Sheets

FOREIGN PATENT DOCUMENTS

| | | |
|---|---|---|
| JP | 08-46280 | 2/1996 |
| JP | 08-046280 | 2/1996 |
| JP | 8-78778 | 3/1996 |
| JP | 8-88431 | 4/1996 |
| JP | 8-181394 | 7/1996 |
| JP | 8-228046 | 9/1996 |
| JP | 10-335383 | 12/1998 |
| JP | 11-340587 | 12/1999 |
| JP | 2001-230502 | 8/2001 |
| JP | 2002-118331 | 4/2002 |
| JP | 2002-299750 | 10/2002 |
| JP | 2003-298193 | 10/2003 |

OTHER PUBLICATIONS

Japanese Office Action issued on Nov. 4, 2009 in connection with corresponding JP Application No. 2005-229321.

* cited by examiner ical disks. By realizing a multi-wavelength laser including such a short-wavelength laser, applications can be more widened.
LASER DIODE

CROSS REFERENCES TO RELATED APPLICATIONS

The present invention contains subject matter related to Japanese Patent Application JP 2005-229321 filed in the Japanese Patent Office on Aug. 8, 2005, the entire contents of which being incorporated herein by reference.

BACKGROUND OF THE INVENTION

1. Field of the Invention

The present invention relates to a laser diode including a plurality of light emitting devices such as a two-wavelength laser and a three-wavelength laser.

2. Description of the Related Art

In recent years, in the field of a laser diode (LD), a multi-wavelength laser having a plurality of light emitting portions with different light emitting wavelengths on the same substrate (or base) has been actively developed. The multi-wavelength laser is used as, for example, a light source for optical disk devices.

In such optical disk devices, laser light in the 700 nm band is used for reproduction in a CD (Compact Disk), and is used for recording and reproduction in a recordable optical disk such as a CD-R (CD Recordable), a CD-RW (CD Rewritable), and an MD (Mini Disk). In addition, in such optical disk devices, laser light in the 600 nm band is used for recording and reproduction in a DVD (Digital Versatile Disk). By mounting the multi-wavelength laser on the optical disk device, recording or reproduction becomes available for a plurality of types of existing optical disks. Further, a short-wavelength laser (400 nm band) using a nitride Group III-V compound semiconductor represented by GaN, an AlGaN mixed crystal, and a GaInN mixed crystal (hereinafter referred to as a GaN semiconductor) is realized. Such a laser is in practical use as a light source of higher density optical disks. By realizing a multi-wavelength laser including such a short-wavelength laser, applications can be more widened.

In the past, as a three-wavelength laser device having a GaN laser oscillation part as described above, the following laser device with the following structure has been proposed (Japanese Unexamined Patent Application Publication No. 2003-298193). In such a structure, a GaN semiconductor is grown on a substrate made of GaN (gallium nitride) to form a first light emitting device with the 400 nm band wavelength (for example, 405 nm). Meanwhile, a device with the 600 nm band (for example, 650 nm) formed by growing an AlGaInP semiconductor and a device with the 700 nm band (for example, 780 nm) formed by growing an AlGaAs semiconductor are provided side by side on the same substrate made of GaAs (gallium arsenic) to form a second light emitting device. The first light emitting device and the second light emitting device are layered in this order on a support base (heat sink). Thereby, heat generated in the second light emitting device is diffused from GaN and the support base which have superior heat conductance. In the result, heat release efficiency can be improved.

SUMMARY OF THE INVENTION

However, in the above structure of Japanese Unexamined Patent Application Publication No. 2003-298193, a distance between a light emitting points of the first light emitting device and the second light emitting device is apart by at least a thickness of the GaN substrate. Therefore, a design margin of an optical pickup is greatly small, and thus high assembly precision is demanded. Further, in general, an electrode pad of the second light emitting device is formed on the first light emitting device, and thus the size of the first light emitting device should be increased by at least the electrode pad size. However, a material cost for the GaN substrate is greatly higher than that for the GaAs substrate. Therefore, when the size of the first light emitting device is increased, the material cost becomes greatly high. As above, in the structure of Japanese Unexamined Patent Application Publication No. 2003-298193, there are disadvantages that assembly is not easy and the material cost is greatly high.

In view of foregoing, in the invention, it is desirable to provide a laser diode which can be easily assembled at a low material cost.

According to an embodiment of the invention, there is provided a laser diode including a first light emitting device having a laser structure on a first substrate, a second light emitting device having a laser structure on a second substrate, and a support base. The first light emitting device and the second light emitting device are layered in this order on the support base in a manner that the respective laser structures of the first light emitting device and the second light emitting device are opposed to each other. Further, a first substrate side of the first light emitting device and a laser structure side of the second light emitting device are electrically connected to the support base.

In the laser diode according to the embodiment of the invention, when electrical power is supplied from the support base side electrically connected to the first light emitting device and the second light emitting device, laser light in given wavelengths is emitted from the first light emitting device and the second light emitting device, respectively. In the case that electrical power is supplied from the support base side as above, it is not necessary to provide a region for connecting a wire led out from an electrical power source on the first light emitting device.

According to the laser diode of the embodiment of the invention, the first substrate side of the first light emitting device and the laser structure side of the second light emitting device are electrically connected to the support base, and thereby electrical power from the support base side can be supplied. Therefore, it is not necessary to provide a region for connecting a wire led out from the electrical power source on the first light emitting device. Thereby, the size of the first light emitting device can be decreased by the above region which has been saved. Here, for example, when the first substrate is made of a GaN substrate and the second substrate is made of a GaAs substrate, a size of the GaN substrate which needs a relatively expensive material cost can be decreased. In the result, the material cost can be reduced.

Further, by layering the first light emitting device and the second light emitting device in this order on the support base in a manner that the respective laser structures are opposed to each other, the distance between the light emitting points of the first light emitting device and the second light emitting device is reduced. Therefore, design margin of optical pickup becomes favorable, and the laser diode can be easily assembled.

Other and further objects, features and advantages of the invention will appear more fully from the following description.

DETAILED DESCRIPTION OF THE PREFERRED EMBODIMENTS

Descriptions will be given of embodiments of the invention in detail with reference to the drawings.

First Embodiment

Figure 1:
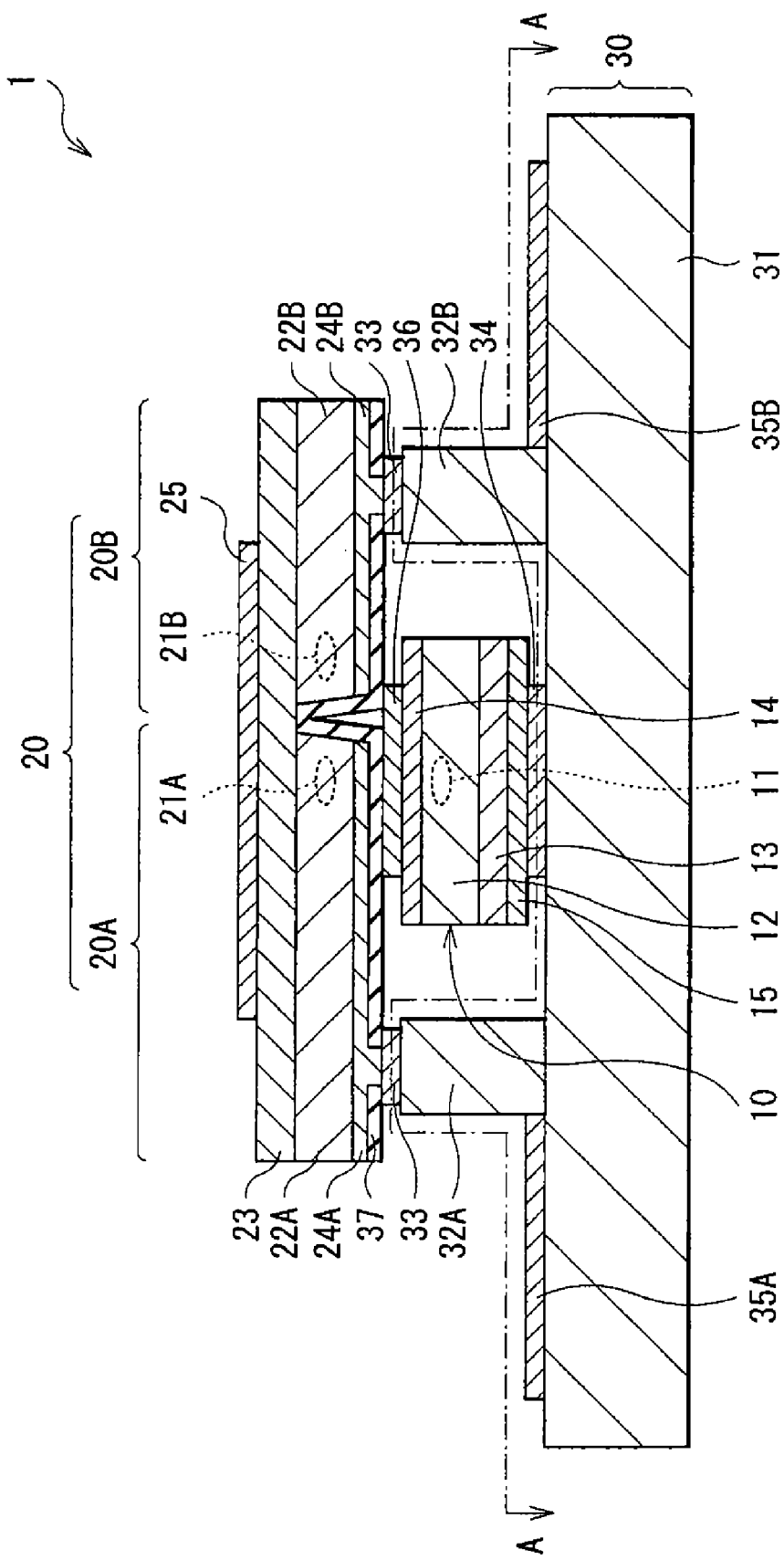
FIG. 1 is a cross section showing a schematic structure of a laser diode according to a first embodiment of the invention.
Figure 2:
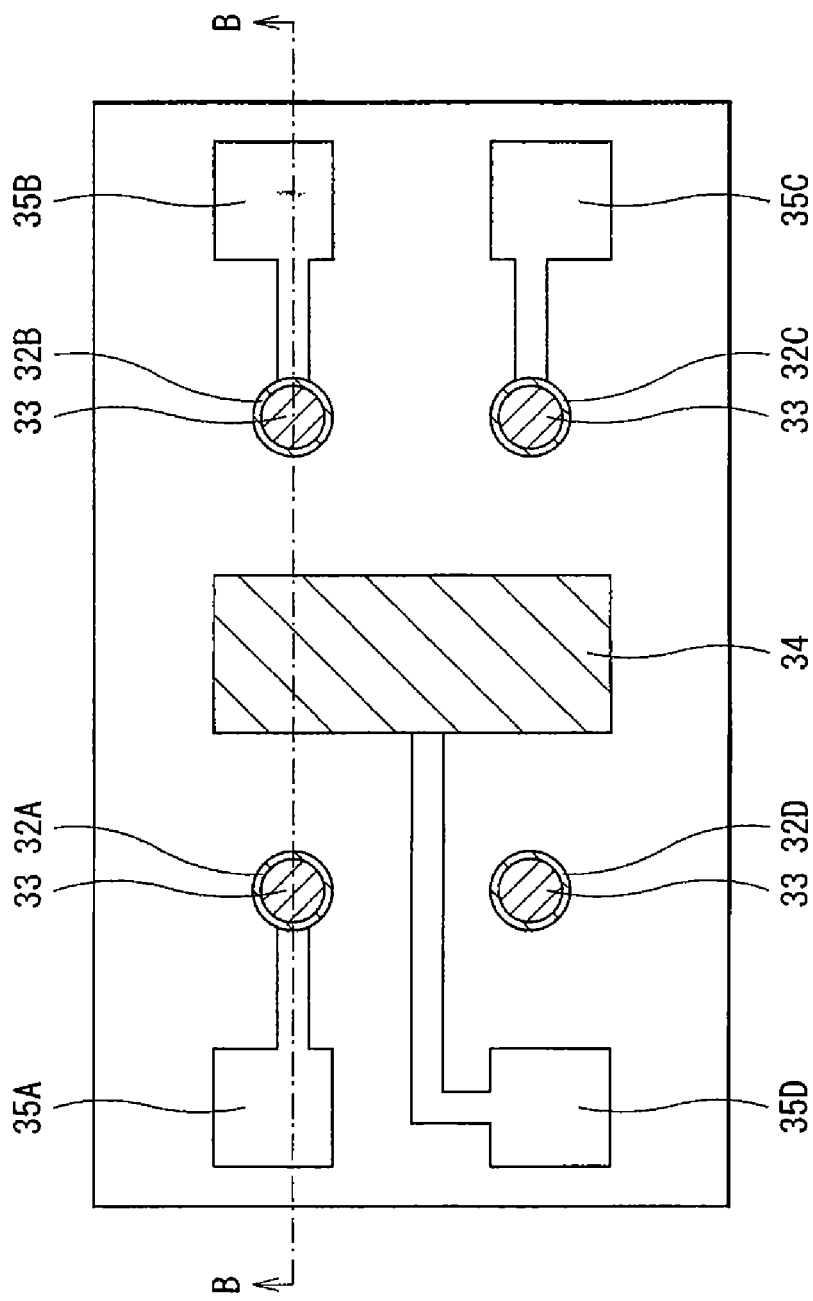
FIG. 2 is another cross section showing a schematic structure of the laser diode of FIG. 1.
Figure 3:
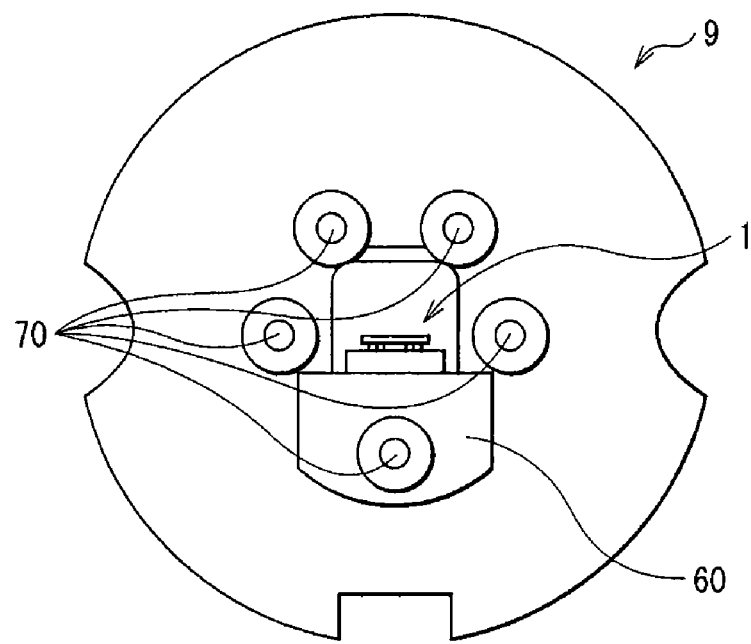
FIG. 3 is a top view showing an application example of the laser diode.
Figure 4:
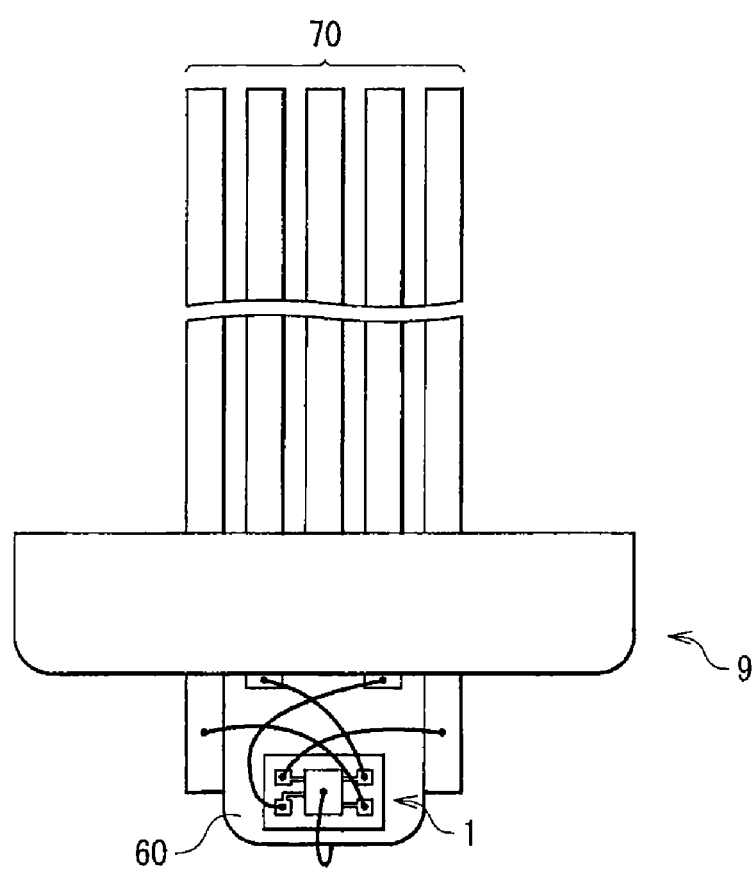
FIG. 4 is a lateral view showing the application example of the laser diode.

FIG. 1 shows a cross sectional structure of a laser diode 1 according to a first embodiment of the invention. FIG. 2 shows a cross sectional structure taken along arrows A-A of the laser diode 1 of FIG. 1. The cross sectional structure of FIG. 1 corresponds to a cross sectional structure taken along arrows B-B of FIG. 2. FIG. 3 and FIG. 4 respectively show a top face structure and a side face structure of a laser diode 9 of this embodiment. The laser diode 9 is structured by mounting the laser diode 1 of FIG. 1 to a heat block 60 and connection terminals 70. FIG. 1 to FIG. 4 show models of the laser diode 1 and the laser diode 9, and the dimensions and the shapes in the figures are different from those used actually.

The laser diode 1 is a device in which a chip-shaped first light emitting device 10 and a chip-shaped second light emitting device 20 are layered in this order on a support base 30. The first light emitting device 10 includes a laser structure 12 forming a light emitting point 11, and is capable of emitting light in the wavelength around 400 nm (for example, 405 nm) for a next generation optical disk. The second light emitting device 20 includes a light emitting device 20A and a light emitting device 20B. The light emitting device 20A has a laser structure 22A forming a light emitting point 21A and is capable of emitting laser light in the 600 nm band (for example, 650 nm) for a DVD. The light emitting device 20B has a laser structure 22B forming a light emitting point 21B and is capable of emitting laser light in the 700 nm band (for example, 780 nm) for a CD. Therefore, the laser diode 1 has a function as a three-wavelength laser device.

The second light emitting device 20 is laid downside up (with the substrate side upward) on the first light emitting device 10, so that the light emitting point 21A becomes close to the light emitting point 11 as long as possible. Thereby, laser light respectively emitted from the light emitting point 11 and the light emitting points 21A, 21B passes through an identical light path, and thus a common lens system (not shown) can be applied thereto.

Descriptions will be hereinafter given of a structure of the support base 30, the first light emitting device 10, and the second light emitting device 20 sequentially.

Support Base 30

The support base 30 includes a heat conductive part 31, a columnar post 32 (32A, 32B, 32C, 32D) (columnar conductive part) provided on the heat conductive part 31, an adhesive layer 33 (conductive adhesive layer) provided on each columnar post 32, an adhesive layer 34 provided on the heat conductive part 31, lead electrodes 35A, 35B, 35C, each of which is provided to contact different columnar post 32, and a lead electrode 35D provided to contact the adhesive layer 34. When the foregoing columnar posts 32A, 32B, 32C, 32D and the foregoing lead electrodes 35A, 35B, 35C, 35D are referred to collectively, they are described as the columnar post 32 and the lead electrode 35, respectively.

The heat conductive part 31 is made of, for example, fired AlN, and is connected to the after-mentioned heat block 60. Such AlN is a material with superior heat conductance having a high heat conductivity of about 200 W/(m·K). Therefore, when AlN is used as the heat conductive part 31, the heat conductive part 31 functions as a heat sink which diffuses heat generated in the laser diode 1.

The columnar post 32 is formed by firing, for example, tungsten (W) or copper (Cu), and supports the second light emitting device 20. The columnar post 32 has a function to supply electrical power from the support base 30 side to the second light emitting device 20. Both tungsten (W) and copper (Cu) are a material with superior heat conductance having a high heat conductivity of about 177 W/(m·K) and about 403 W/(m·K), respectively. Therefore, when fired tungsten (W) or fired copper (Cu) is used as the columnar post 32, the columnar post 32 also functions as a heat sink which release heat generated in the second light emitting device 20 connected to the columnar post 32 with the adhesive layer 33 in between.

The adhesive layer 33 contains, for example, an alloy of gold (Au) and tin (Sn), or tin. The adhesive layer 33 is electrically connected to the columnar post 32. The adhesive layer 34 contains, for example, an alloy of gold (Au) and tin (Sn), or tin. The adhesive layer 34 is electrically connected to an n-side electrode 15 (described later) of the first light emitting device 10.

Thereby, the columnar post 32A is connected to a p-side electrode 24A (described later) of the light emitting device 20A with the adhesive layer 33 in between. The columnar post 32B is connected to a p-side electrode 24B (described later) of the first light emitting device 20B with the adhesive layer 33 in between. The columnar post 32C is connected to a p-side electrode 14 (described later) of the first light emitting device 10 with the adhesive layer 33 and an adhesive layer 36 in between. The columnar post 32D is provided to support the second light emitting device 20 in a balanced manner and is electrically insulated from the first light emitting device 10 and the second light emitting device 20 with an insulating layer 37 in between.

The adhesive layer 36 contains, for example, an alloy of gold (Au) and tin (Sn), or tin. The insulating layer 37 contains an insulating material not containing oxygen as a main material such as AlN (aluminum nitride), BN (boron nitride), SiC (silicon carbide), GaN, and AlGaInN (aluminum gallium indium nitrogen), being, for example, about 300 nm thick, which has a higher heat conductivity compared to $SiO_2$ and ZrOx.

The lead electrode 35 mainly contains gold (Au), for example. One end of the lead electrode 35 is stripe-shaped. One end of the lead electrode 35A is electrically connected to the columnar post 32A. One end of the lead electrode 35B is electrically connected to the columnar post 32B. One end of the lead electrode 35C is electrically connected to the columnar post 32C. One end of the lead electrode 35D is electrically connected to the adhesive layer 34. Therefore, one end of the lead electrode 35A is electrically connected to the p-side electrode 24A of the light emitting device 20A. One end of the lead electrode 35B is electrically connected to the p-side electrode 24B of the light emitting device 20B. One end of the lead electrode 35C is electrically connected to the p-side electrode 14 of the first light emitting device 10. One end of the lead electrode 35D is electrically connected to the n-side electrode 15 of the first light emitting device 10. Meanwhile, the other end of the lead electrode 35 is pad-shaped, and is electrically connected to a wire lead out from the connection terminal 70. The connection terminal 70 is connected to an electrical power source (not shown) which supplies electrical power to the first light emitting device 10 and the second light emitting device 20. The other ends of the lead electrodes 35A, 35B, 35C are connected to a positive electrode of the electrical power source, and the other end of the lead electrode 35D is connected to a negative electrode of the electrical power source, respectively. That is, the lead electrode 35 demanding a large area is provided on the support base 30 and not provided in the first light emitting device 10.

First Light Emitting Device 10

Next, a description will be given of a structure of the first light emitting device 10. The first light emitting device 10 is capable of emitting light in the wavelength about 400 nm (for example, 405 nm), and is made of a nitride Group III-V compound semiconductor. The nitride Group III-V compound semiconductor herein means a semiconductor containing at least one of Group 3B elements in the short period periodic table and at least nitrogen (N) of Group 5B elements in the short period periodic table.

The first light emitting device 10 is formed by growing the laser structure 12 on a substrate 13 (first substrate). The laser structure 12 includes, for example, an n-type cladding layer, an active layer, a p-type cladding layer, and a p-side contact layer.

Specifically, the substrate 13 is made of, for example, n-type GaN. The thickness in the lamination direction (hereinafter simply referred to as thickness) is, for example, from 80 to 100 μm. GaN is a material with superior heat conductance having a high heat conductivity of about 130 W/(m·K). Therefore, when n-type GaN is used as the substrate 13, the substrate 13 also functions as a heat sink which diffuses heat generated in the laser diode 1.

The n-type cladding layer is made of, for example, n-type AlGaN being 1 μm thick. The active layer has, for example, a multiquantum well structure composed of a well layer and a barrier layer which are respectively made of $Ga_xIn_{1-x}N$ ($x \geq 0$) with a composition different from each other, being 30 nm thick. The p-type cladding layer is made of, for example, p-type AlGaN being 0.7 μm thick. The p-side contact layer is made of, for example, p-type GaN being 0.1 μm thick.

Part of the p-type cladding layer and the p-side contact layer are formed of a stripe-shaped ridge (not shown) which extends in the direction perpendicular to the paper sheet (resonator direction), and thereby current confinement is performed. A region of the active layer corresponding to the ridge is the light emitting point 11.

An insulating layer (not shown) is provided on the continuous surface from the side face of the ridge to the surface of the p-type cladding layer, that is, on the surface other than the top face of the ridge. The insulating layer has a structure similar to that of the foregoing insulating layer 36. Thereby, a current flows in the active layer only from the top face of the ridge. Therefore, the insulating layer has a current confinement function.

The p-side electrode 14 is provided on the top face of the ridge, that is, on the surface of the p-side contact layer and is electrically connected to the p-side contact layer. The p-side electrode 14 is also electrically connected to the adhesive layer 36 provided on the second light emitting device 20 side, and is connected to the positive electrode of the electrical power source through the adhesive layer 36. The n-side electrode 15 is provided on the rear face of the substrate 13 and is electrically connected to the substrate 13. The n-side electrode 15 is also electrically connected to the adhesive layer 34 of the support base 30, and is connected to the negative electrode of the electrical power source through the adhesive layer 34. The p-side electrode 14 and the n-side electrode 15 have a multilayer structure in which, for example, Pd (palladium) being 50 nm thick and Pt (platinum) being 100 nm thick are layered in this order.

A pair of reflector films (not shown) is formed on the surface perpendicular to the extending direction (axis direction) of the ridge. One of the reflector films (main emitting side) is made of, for example, aluminum oxide ($Al_2O_3$), and is adjusted to have a low reflectance. Meanwhile, the other reflector film is formed by alternately layering, for example, an aluminum oxide layer and a titanium oxide ($TiO_2$) layer, and is adjusted to have a high reflectance. Thereby, light generated in the light emitting point 11 in the active layer travels between the pair of reflector films and amplified, and then emitted as a beam from the reflector film on the low reflectance side.

As above, the first light emitting device 10 is not provided with the lead electrode 35, and only provided with the p-side electrode 14 contacting the second light emitting device 20 on the top face with the adhesive layer 36 and the insulating layer 37 in between, and with the n-side electrode 15 contacting the support base 30 on the bottom face with the adhesive layer 34 in between. Therefore, the first light emitting device 10 does not need an area large enough for wire bonding. Compared to the existing device provided with a lead electrode, the size of the first light emitting device 10 can be smaller by a region needed for providing a lead electrode. Light emitting device 20A in the second light emitting device 20

Next, a structure of the light emitting device 20A will be described. The light emitting device 20A is capable of emitting light in the 600 nm band (for example, 650 nm), and is made of an aluminum gallium indium phosphorus (AlGaInP) Group III-V compound semiconductor. The aluminum gallium indium phosphorus Group III-V compound semiconductor herein means a semiconductor containing at least aluminum (Al), gallium (Ga), and indium (In) of Group 3B elements in the short period periodic table and at least phosphorus (P) of Group 5B elements in the short period periodic table.

The light emitting device 20A is formed by growing the laser structure 22A on a substrate 23 (second substrate). The laser structure 22A includes, for example, the n-type cladding layer, the active layer, the p-type cladding layer, and the p-side contact layer.

Specifically, the substrate 23 is made of, for example, n-type GaAs, and is, for example, about 100 μm thick. GaAs is a material with inferior heat conductance having a low heat conductivity of about 17.8 W/(m·K) compared to the above-mentioned GaN and AlN. Therefore, in this embodiment, as described above, the second light emitting device 20 is laid downside up (with the substrate 23 side upward) on the laser structure 12 side of the first light emitting device 10, and the first light emitting device 10 and the second light emitting device 20 are layered in this order on the support base 30. Thereby, heat generated in the light emitting device 20A (and the light emitting device 20B described later) is diffused from the first light emitting device 10 and the columnar post 32 which have superior heat conductance, and diffused from the support base 30 and the heat block through the first light emitting device 10 and the columnar post 32.

The n-type cladding layer is made of, for example, n-type AlGaInP being 1.5 μm thick. The active layer has, for example, a multiquantum well structure composed of a well layer and a barrier layer which are respectively made of $Al_xGa_yIn_{1-x-y}P$ ($0 \leq x \leq 1$, $0 \leq y \leq 1$ and $0 \leq x+y \leq 1$) with a composition different from each other, being 40 nm thick. The p-type cladding layer is made of, for example, p-type AlGaInP being 1.5 μm thick. The p-side contact layer is made of, for example, p-type GaP being 0.5 μm thick. Part of the p-type cladding layer and the p-side contact layer have a stripe-shaped ridge which extends in the resonator direction, and thereby current confinement is performed. A region of the active layer corresponding to the ridge is the light emitting point 21A.

An insulating layer (not shown) is provided on the continuous surface from the side face of the ridge to the surface of the p-type cladding layer, that is, on the surface other than the top face of the ridge. The insulating layer has a structure similar to that of the foregoing insulating layer 36. Thereby, a current flows in the active layer only from the top face of the ridge. Therefore, the insulating layer has a current confinement function.

The p-side electrode 24A is provided on the top face of the ridge, that is, on the surface of the p-side contact layer and is electrically connected to the p-side contact layer. The p-side electrode 24A is also electrically connected to the adhesive layer 33 provided on the columnar post 32A, and is connected to the positive electrode of the electrical power source through the adhesive layer 33. An n-side electrode 25 is provided on the rear face of the substrate 23 and is electrically connected to the substrate 23. The n-side electrode 25 is a pad-shaped, and is electrically connected to a wire led out from the connection terminal 70. As described above, the connection terminal 70 is electrically connected to the electrical power source. Thus, the n-side electrode 25 is connected to the negative electrode of the electrical power source. The n-side electrode 25 is an electrode common to the light emitting device 20A and the light emitting device 20B. The p-side electrode 24 and the n-side electrode 25 have a multilayer structure in which, for example, Ti (titanium) being 15 nm thick, Pt (platinum) being 50 nm thick, and Au (gold) being 300 nm thick are layered in this order.

A pair of reflector films (not shown) is formed on the surface perpendicular to the extending direction (axis direction) of the ridge. The pair of reflector films has a structure similar to that of the foregoing pair of reflector films formed on the end face of the first light emitting device 10. Thereby, light generated in the light emitting point 21A in the active layer travels between the pair of reflector films and amplified, and then emitted as a beam from the reflector film on the low reflectance side.

Light Emitting Device 20B in the Second Light Emitting Device 20

Next, a structure of the light emitting device 20B will be described. The light emitting device 20B is capable of emitting light in the 700 nm band (for example, 780 nm), and is made of a gallium arsenic (GaAs) Group III-V compound semiconductor. The gallium arsenic Group III-V compound semiconductor herein means a semiconductor containing at least gallium (Ga) of Group 3B elements in the short period periodic table and at least arsenic (As) of Group 5B elements in the short period periodic table.

The light emitting device 20B is formed by growing the laser structure 22B on the substrate (substrate 23) common to the light emitting device 20A. The laser structure 22B includes, for example, the n-type cladding layer, the active layer, the p-type cladding layer, and the p-side contact layer.

Specifically, the n-type cladding layer is made of, for example, n-type AlGaAs being 1.5 μm thick. The active layer has a multiquantum well structure composed of a well layer and a barrier layer which are respectively made of $Al_xGa_{1-x}As$ ($0 \leq x \leq 1$) with a composition different from each other, being 35 nm thick. The p-type cladding layer is made of, for example, p-type AlGaAs being 1.0 μm thick. The p-side contact layer is made of, for example, p-type GaAs being 0.5 μm thick. Part of the p-type cladding layer and the p-side contact layer have a stripe-shaped ridge which extends in the resonator direction, and thereby current confinement is performed. A region of the active layer corresponding to the ridge is the light emitting point 21B.

An insulating layer (not shown) is provided on the continuous surface from the side face of the ridge to the surface of the p-type cladding layer, that is, on the surface other than the top face of the ridge. The insulating layer has a structure similar to that of the foregoing insulating layer 36. Thereby, a current flows in the active layer only from the top face of the ridge. Therefore, the insulating layer has a current confinement function.

The p-side electrode 24B is provided on the top face of the ridge, that is, on the surface of the p-side contact layer and is electrically connected to the p-side contact layer. The p-side electrode 24B is also electrically connected to the adhesive layer 33 provided on the columnar post 32B, and is connected to the positive electrode of the electrical power source through the adhesive layer 33. The p-side electrode 24B is electrically insulated from the p-side electrode 24A of the light emitting device 20A by the insulating layer 37. The p-side electrode 24B has a structure similar to that of the foregoing p-side electrode 24A.

As described above, the second light emitting device 20 is supported by the columnar post 32. Therefore, even when the first light emitting device 10 is smaller than the second light emitting device 20, the second light emitting device 20 can be easily arranged on the first light emitting device 10. Further, the columnar post 32 has a heat release function and an electrical poser supply function. Therefore, the columnar post 32 effectively releases heat generated in the second light emitting device 20. In addition, even when a p-side lead electrode large enough for wire bonding is not provided on the second light emitting device 20, electrical power can be provided. Consequently, it is enough the second light emitting device 20 has a minimum size in which the second light emitting device 20 can contact the first light emitting device 10 and the columnar post 32.

The laser diode 9 having the foregoing structure can be fabricated as follows, for example.

First, the first light emitting device 10 is fabricated. Specifically, the n-side contact layer, the n-type cladding layer, the active layer, the p-type cladding layer, and the p-type contact layer are layered in this order on the substrate 13. After that, the p-side contact layer and the p-type cladding layer are provided with patterning by, for example, dry etching so that a narrower stripe-shaped convex is obtained to form the laser structure 12. Next, for example, AlN is deposited on the laser structure 12 by vapor deposition or sputtering. After that, a portion corresponding to the top face of the ridge is removed by etching to form the insulating layer. Next, for example, Ti, Pt, and Au are layered in this order on the insulating layer and the top face of the ridge to form the p-side electrode 14. The n-side electrode 15 is formed similarly on the rear face of the substrate 13.

Next, the second light emitting device 20 is formed in a procedure similar to that of the first light emitting device 10. After that, for example, AlN is deposited by vapor deposition or sputtering on the surface of the laser structures 22A, 22B side of the second light emitting device 20. Subsequently, a portion to be faced to the columnar post 32 is removed by etching to form the insulating layer 37.

Next, for example, an alloy of gold (Au) and tin (Sn) is deposited on a region of the insulating layer 37 to be faced to the p-side electrode 14 of the first light emitting device 10 and on a region between the foregoing region of the insulating layer 37 and the columnar post 32C to form the adhesive layer 36. Further, for example, an alloy of gold (Au) and tin (Sn) is deposited on a region of the p-side electrodes 24A, 24B where the insulating layer 37 is removed and the p-side electrodes 24A, 24B are exposed to form the adhesive layer 33. After that, the adhesive layer 36 and the p-side electrode 14 of the first light emitting device 10 are layered. Thereby, the first light emitting device 10 and the second light emitting device 20 are layered so that the laser structure 12 side and the laser structure 22A are opposed to each other.

Next, the support base 30 is fabricated. Specifically, for example, tungsten (W) is arranged on a given position of, for example, an AlN substrate by, for example, printing method. After that, the AlN substrate and tungsten (W) are fired to form the heat conductive part 31 and the columnar post 32. Subsequently, the adhesive layer 33 is formed on the columnar post 32, the adhesive layer 34 is formed on an area of the heat conductive part 31 to be faced to the n-side electrode 15 of the first light emitting device 10, and the lead electrode 35 is formed to contact the columnar post 32.

Next, the layered first light emitting device 10 and the second light emitting device 20 are arranged on the support base 30 in a manner that the first light emitting device 10 is set as a lower side. At this time, arrangement is made so that the n-side electrode 15 of the first light emitting device 10 is electrically connected to the adhesive layer 34 of the support base 30, and the p-side electrodes 24A, 24B of the second light emitting device 20 are electrically connected to the adhesive layer 33 of the support base 30. Thereby, the laser diode 1 of this embodiment is fabricated.

Further, the laser diode 1 is mounted on the heat block 60. For example, as shown in FIG. 3 and FIG. 4, wires led out from the connection terminal 70 are respectively connected to the lead electrode 35 and the n-side electrode 25. Thereby, the laser diode 9 of this embodiment is fabricated.

In the laser diode 9 fabricated as above, when a voltage from the electrical power source is applied between the p-side electrode 14 and the n-side electrode 15 through the connection terminal 70, a current is injected in the active layer, light emission is generated by electron-hole recombination, and laser light in the wavelength around 400 nm (for example, 405 nm) is emitted from the light emitting point 11 of the first light emitting device 10. Similarly, when a voltage is applied between the p-side electrode 24A and the n-side electrode 25, laser light in the 600 nm band (for example, 650 nm) is emitted from the light emitting point 21A of the light emitting device 20A. When a voltage is applied between the p-side electrode 24B and the n-side electrode 25, laser light in the 700 nm band (for example, 780 nm) is emitted from the light emitting point 21B of the light emitting device 20B. As above, the first light emitting device 10, the light emitting device 20A, and the light emitting device 20B can independently emit laser light in the wavelength different from each other.

At this time, in the laser diode device, Joule heat is generated due to a high current density. The heat generated in the first light emitting device 10 is diffused from the support base 30 and the heat block 60, and diffused to the second light emitting device 20 side through the insulating layer 37. Meanwhile, the heat generated in the second light emitting device 20 is diffused to the substrate 23 side, and diffused to the first light emitting device 10 side through the insulating layer 37.

As above, in the laser diode device of this embodiment, the first light emitting device 10 and the second light emitting device 20 are layered on the support base 30 in this order in a manner that the laser structures 12 and laser structures 22A, 22B are opposed to each other, and the insulating layer 37 with favorable heat release characteristics is provided. Thereby, heat in the laser diode device can be sufficiently diffused, and thus heat resistance is decreased, and heat release characteristics become favorable. In the result, the heat release characteristics can be improved. Therefore, characteristics and reliability of the laser diode device can be improved.

Further, since the first light emitting device 10 and the second light emitting device 20 are layered in this order on the support base 30 in a manner that the laser structures 12 and laser structures 22A, 22B are opposed to each other, a distance between the light emitting points of the first light emitting device 10 and the second light emitting device 20 is reduced. Therefore, design margin of optical pickup is favorable. In the result, the laser diode can be easily assembled.

Further, in this embodiment, the substrate 13 side of the first light emitting device 10 and the laser structures 22A, 22B side of the second light emitting device 20 are electrically connected to the support base 30. Thereby, electrical power can be supplied from the support base 30 side. In the result, it is not necessary to provide the lead electrode 35 on the first light emitting device 10. Thereby, the size of the first light emitting device 10 can be decreased, that is, the size of the GaN substrate can be decreased. Therefore, the material cost can be reduced.

Second Embodiment

Figure 5:
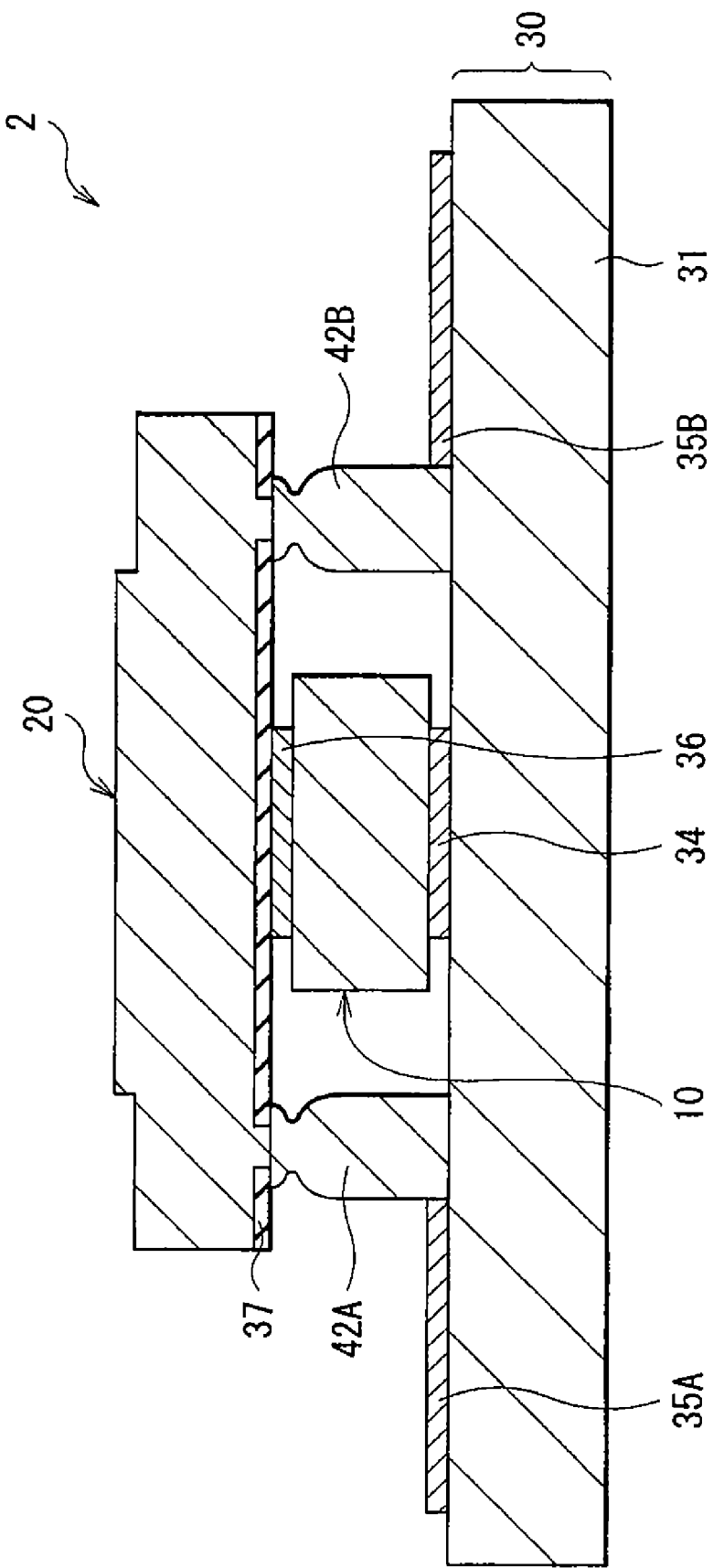
FIG. 5 is a cross section showing a schematic structure of a laser diode according to a second embodiment of the invention.

FIG. 5 shows a cross sectional structure of a laser diode 2 according to a second embodiment of the invention. In FIG. 5, internal structures of the first light emitting device 10 and the second light emitting device 20 are omitted.

The laser diode 2 is different from the foregoing first embodiment in that the laser diode 2 includes a bump 42 (deformable conductive part) instead of the columnar post 32 and the adhesive layer 33. Therefore, a description will be hereinafter mainly given of differences from the first embodiment, and structures, actions, and effects similar to those of the first embodiment will be omitted as appropriate.

The bump 42 contains a deformable conductive material such as gold (Au). The bump 42 supports the second light emitting device 20, and supplies electrical power from the support base 30 side to the second light emitting device 20 similarly to the columnar post 32 of the first embodiment. Gold (Au) is a material with superior heat conductance having a high heat conductivity of about 300 W/(m·K). Therefore, when gold (Au) is used as the bump 42, the bump 42 also functions as a heat sink which releases heat generated in the second light emitting device 20.

The bump 42 has deformability as described above. Therefore, even when the height of the bump 42 before the first light emitting device 10 and the second light emitting device 20 are arranged on the support base 30 is larger than the total thickness of the first light emitting device 10, the adhesive layer 34 and the adhesive layer 36, the bump 42 can be pressed by the second light emitting device 20. Therefore, when the height of the bump 42 before being pressed by the second light emitting device 20 is larger than the total thickness of the first light emitting device 10, the adhesive layer 34, and the adhesive layer 36, the p-side electrodes 24A, 24B of the second light emitting device 20 can be electrically jointed with the support base 30 securely, even if the thicknesses thereof vary.

Figure 6:
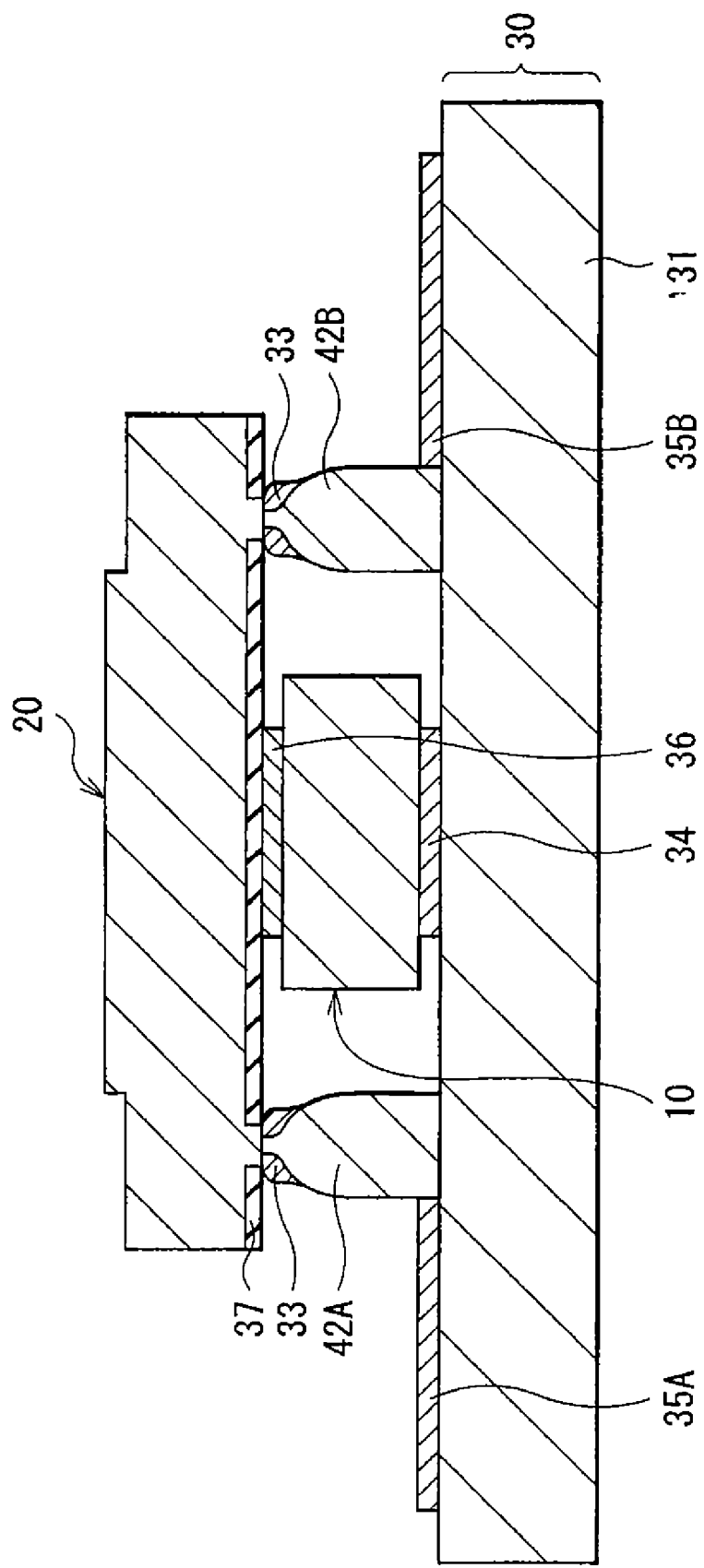
FIG. 6 is a cross section showing a schematic structure of a modification of the laser diode of FIG. 5.

As shown in FIG. 6, it is possible to improve electrical contact characteristics with the p-side electrodes 24A, 24B of the second light emitting device 20 by providing the adhesive layer 33 in the upper part of the bump 42.

Figure 7:
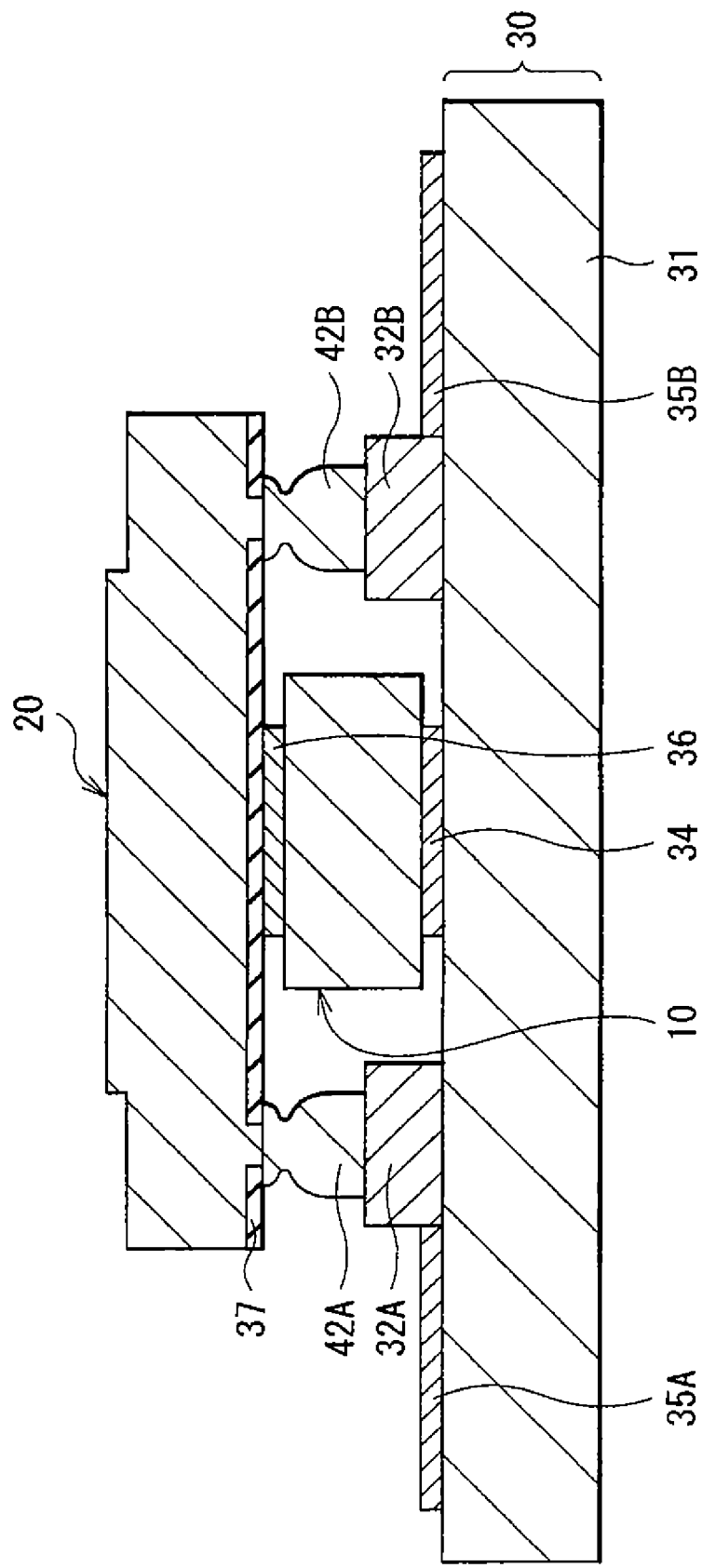
FIG. 7 is a cross section showing a schematic structure of another modification of the laser diode.
Figure 8:
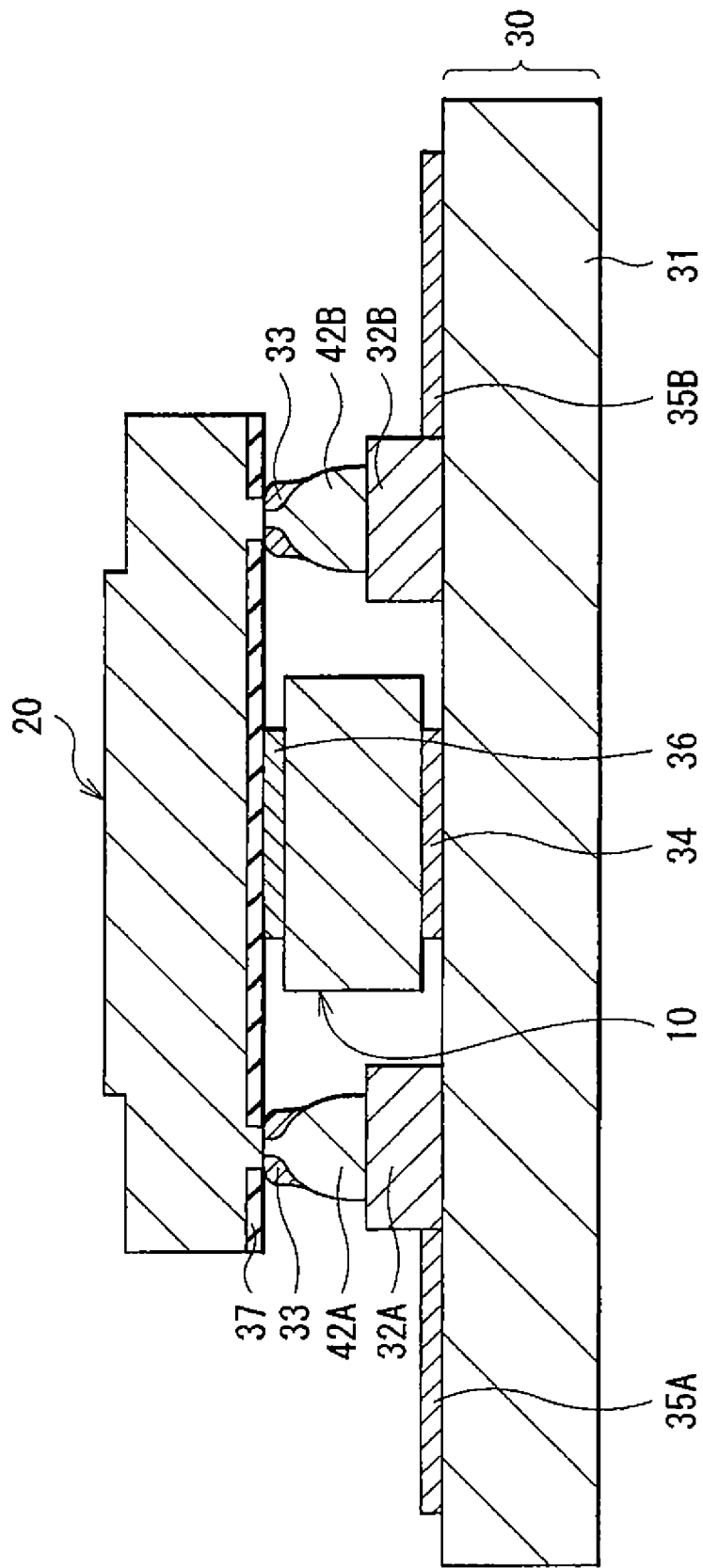
FIG. 8 is a cross section showing a schematic structure of another modification of the laser diode.

As shown in FIG. 7, it is possible that the height of the bump 42 is smaller than that of this embodiment by providing the bump 42 on the columnar post 32. Further, as shown in FIG. 8, it is possible to improve electrical contact characteristics with the p-side electrodes 24A, 24B of the second light emitting device 20 by providing the adhesive layer 33 in the upper part of the bump 42.

Third Embodiment

Figure 9:
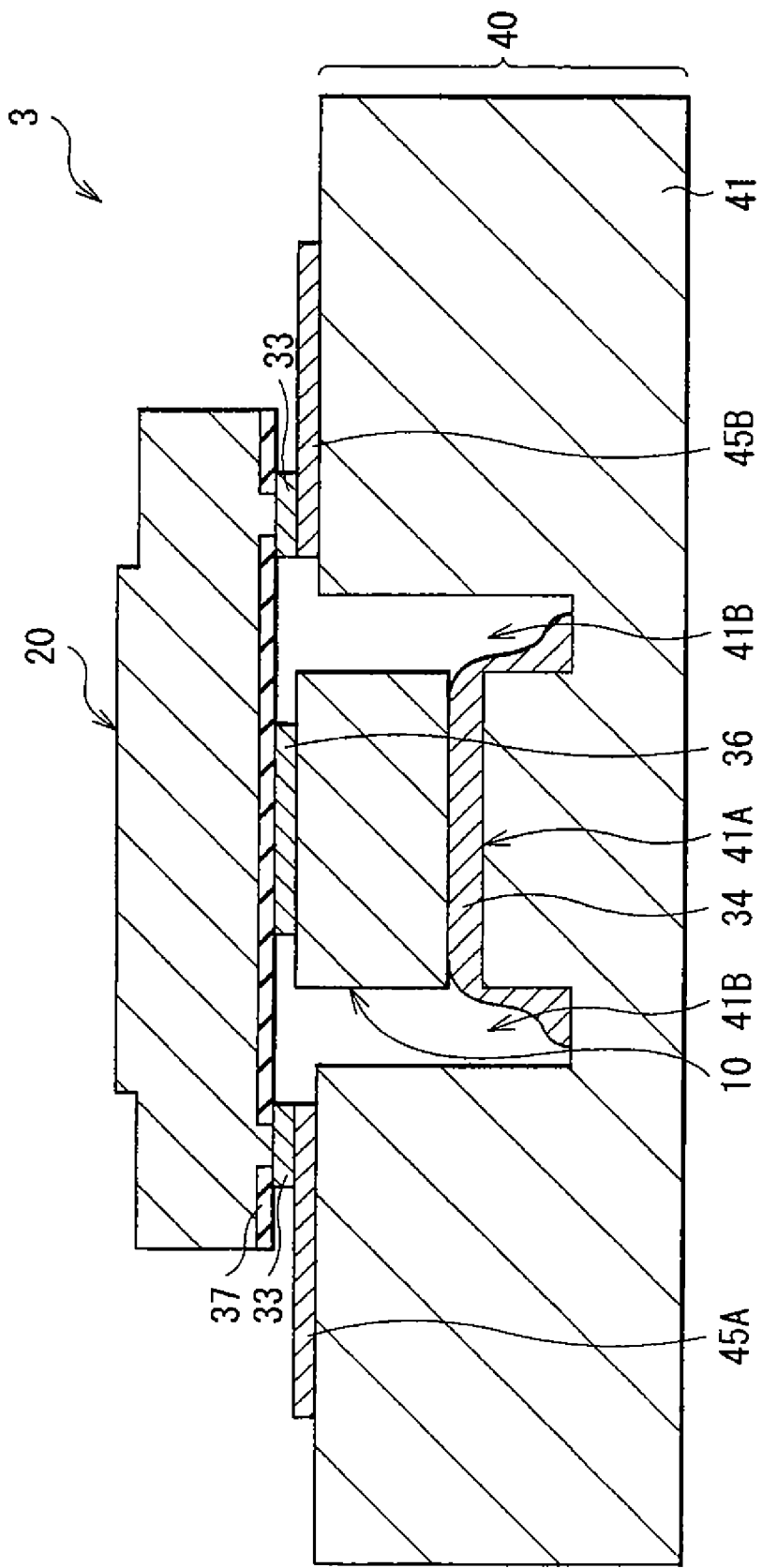
FIG. 9 is a cross section showing a schematic structure of a laser diode according to a third embodiment of the invention.
Figure 10:
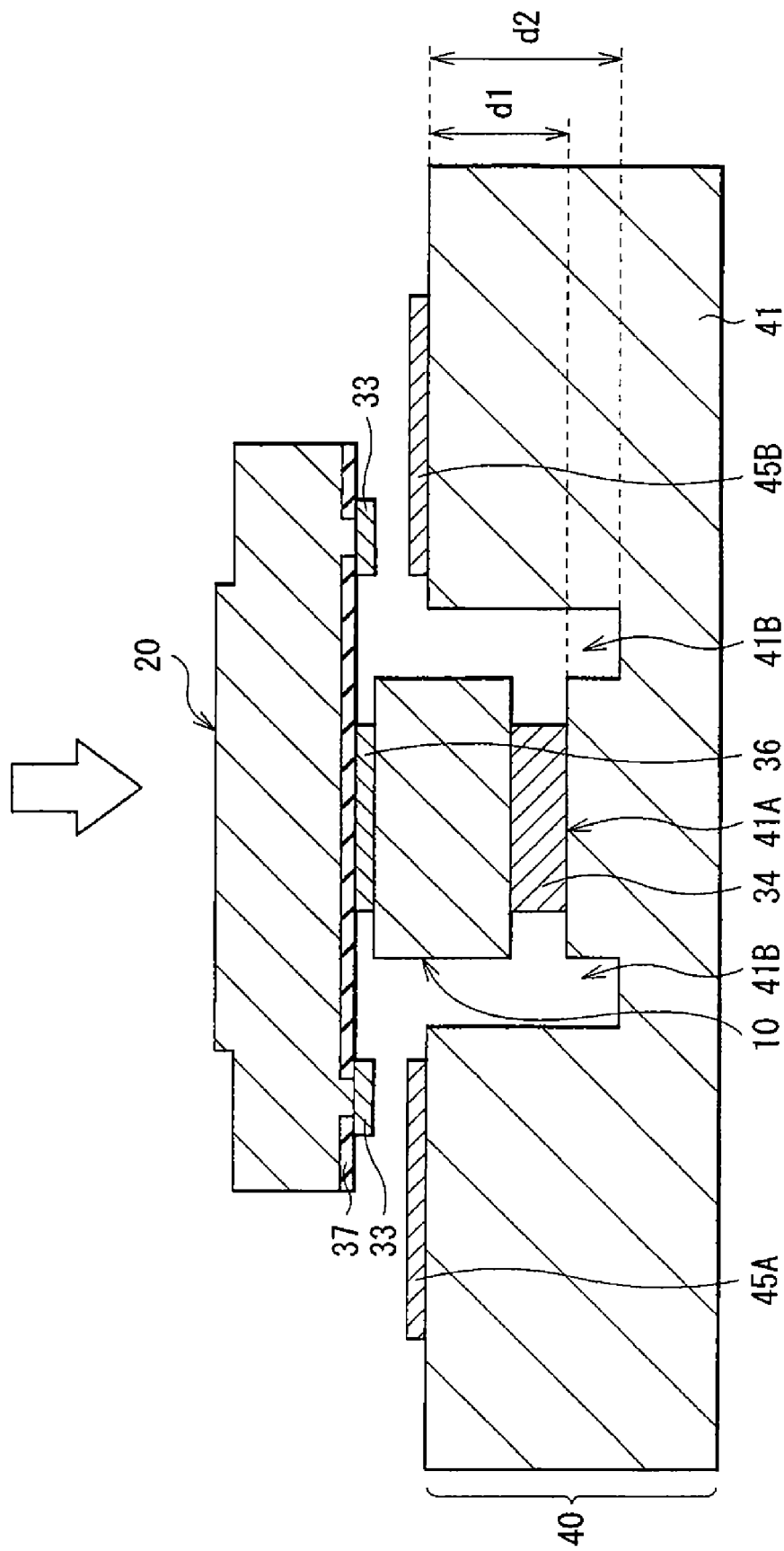
FIG. 10 is a cross section showing a schematic structure of a modification of the laser diode of FIG. 9.

FIG. 9 shows a cross sectional structure of a laser diode 3 according to a third embodiment of the invention. FIG. 10 shows a step of arranging the first light emitting device 10 and the second light emitting device 20 on a support base 40. In FIG. 9 and FIG. 10, internal structures of the first light emitting device 10 and the second light emitting device 20 are omitted.

The laser diode 3 is different from the foregoing first embodiment in that the laser diode 3 includes a heat conductive part 41 provided with a groove 41A instead of the columnar post 32. Therefore, a description will be hereafter mainly given of differences from the first embodiment, and structures, actions, and effects similar to those of the first embodiment will be omitted as appropriate.

The heat conductive part 41 has a groove 41A provided in a region opposed to the first light emitting device 10 and a side groove 41B provided in the both sides of the groove 41A. The groove 41A is composed of a groove with a depth of d1 into which the whole or part of the first light emitting device 10 can be inserted. The bottom face of the groove 41A supports the first light emitting device 10. The side groove 41B is composed of a groove with a depth of d2 which is equal to or deeper than the depth of the groove 41A. The adhesive layer 34 pushed from the groove 41A when the first light emitting device 10 is arranged on the bottom face of the groove 41A is held in the side groove 41B.

When the depth d1 of the groove 41A is deep enough to the degree that the whole of the first light emitting device 10 is inserted, for example, when the depth d1 of the groove 41A is larger than the total value of the thickness of the first light emitting device 10 and the thickness of the adhesive layer 36, it is necessary that there is no clearance between the adhesive layer 34 and the n-side electrode 15 of the first light emitting device 10, even if there are variations in the thickness of the first light emitting device 10 and the depth of the groove 41A. To prevent such a clearance, for example, it is desirable that the thickness of the adhesive layer 34 is determined by considering variations in the thickness of the first light emitting device 10 and the depth of the groove 41A. When the thickness of the adhesive layer 34 is determined by considering such variations as above, though the adhesive layer 34 may be pushed from the groove 41A when the first light emitting device 10 is inserted in the groove 41A, the pushed portion of the adhesive layer 34 is held in the side groove 41B. Therefore, there is no risk that the adhesive layer 34 is electrically contacted to a lead electrode 45.

Figure 11:
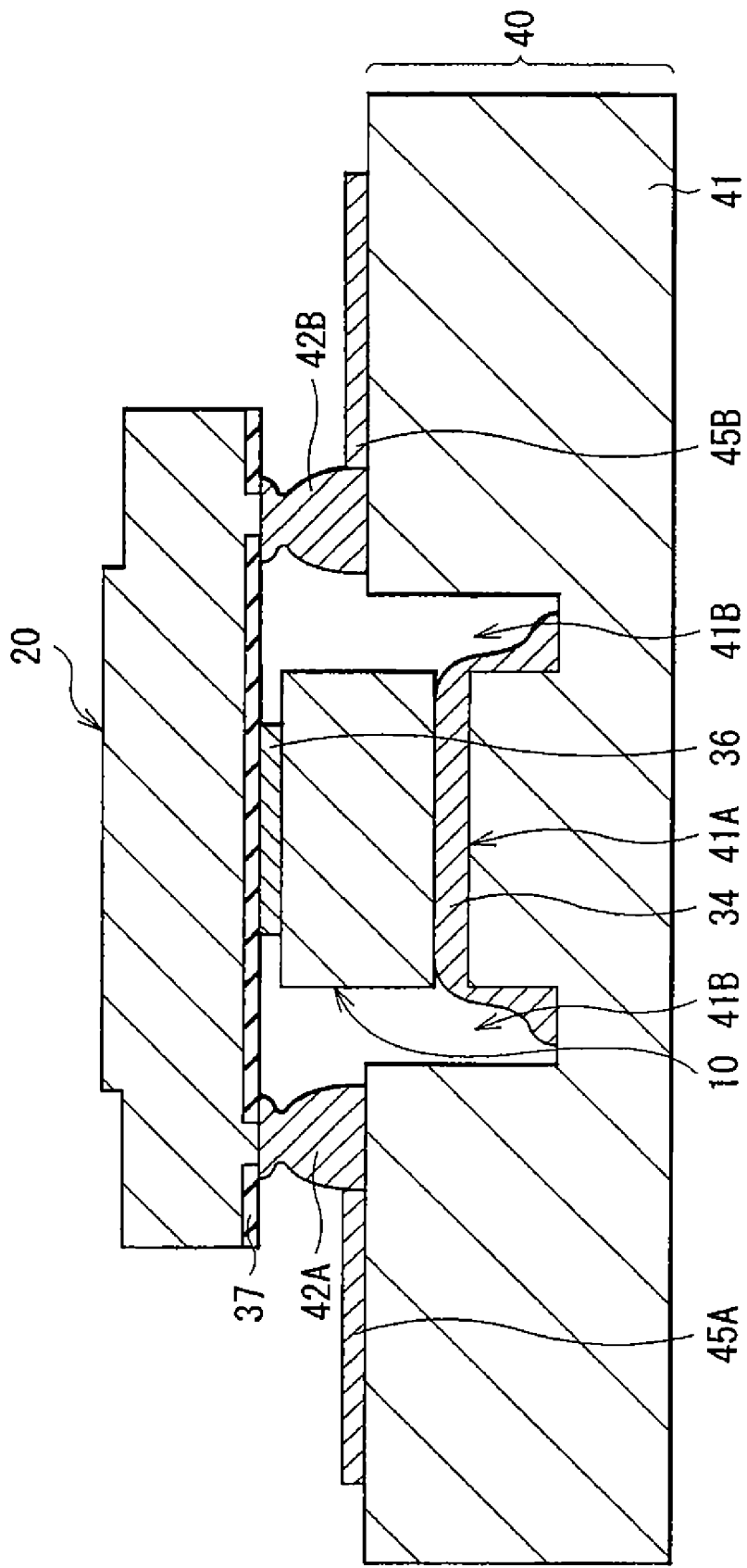
FIG. 11 is a cross section showing a schematic structure of a modification of the laser diode.
Figure 12:
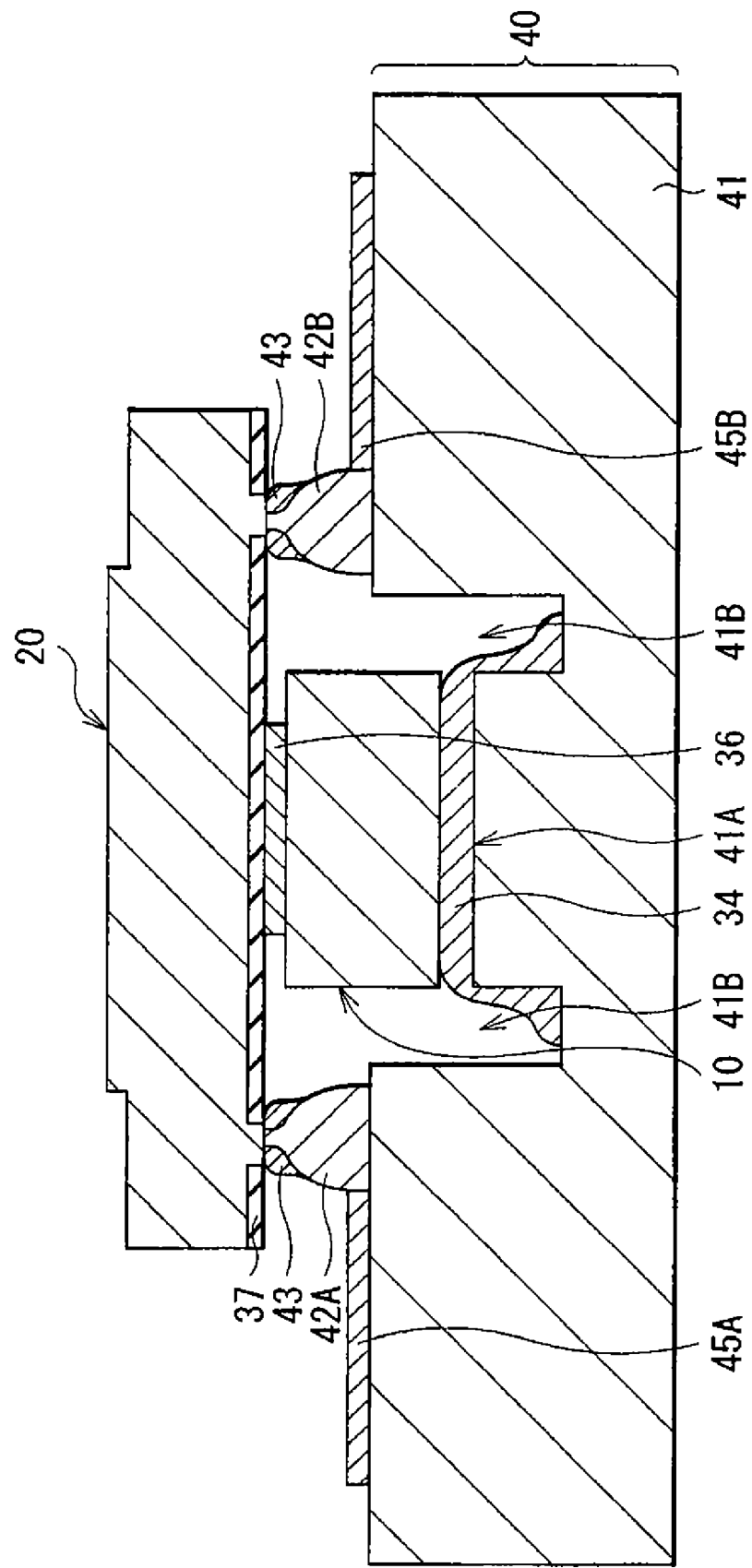
FIG. 12 is a cross section showing a schematic structure of another modification of the laser diode.

On the contrary, when the depth d1 of the groove 41A is shallow to the degree that the whole of the first light emitting device 10 is not able to be inserted, for example, when the depth d1 of the groove 41A is smaller than the total value of the thickness of the first light emitting device 10, the thickness of the adhesive layer 34, and the thickness of the adhesive layer 36, it is necessary that there is no clearance between a lead electrode 45 of the support base 40 and the adhesive layer 33. To prevent such a clearance, for example, it is desirable that the thickness of the adhesive layer 33 and the thickness of the lead electrode 35 are increased, or the bump 42 is provided as shown in FIG. 11, or an adhesive layer 43 is provided in the upper part of the bump 42 as shown in FIG. 12.

While the descriptions have been hereinbefore given of the invention with reference to the embodiments, the invention is not limited to the foregoing embodiments, and various modifications may be made.

For example, in the foregoing embodiments, after the columnar post 32 or the bump 42 is formed on the heat conductive part 31 or 41, the support base 30 and the first light emitting device 10/the second light emitting device 20 are electrically connected. However, it is possible that after the columnar post 32 or the bump 42 is formed on the second light emitting device 20, or the heat conductive parts 31, 41 and the second light emitting device 20, the support base 30 and the first light emitting device 10/the second light emitting device 20 are electrically connected.

Further, in the foregoing embodiments, the descriptions have been given with reference to the nitride Group III-V compound laser diode as the first light emitting device 10 and the gallium arsenic (GaAs) Group III-V compound laser diode as the second light emitting device 20 respectively and with illustrative examples of the compositions and the structures thereof. However, the invention can be similarly applied to a laser diode having other composition or other structure.

Further, in the foregoing embodiments, the descriptions have been given of the laser diode in which the first light emitting device 10 includes the single laser structure 12 and the second light emitting device 20 includes the two laser structures 24A, 24B. However, the invention can be similarly applied to laser diodes having other structure.

It should be understood by those skilled in the art that various modifications, combinations, sub-combinations and alternations may occur depending on design requirements and other factors insofar as they are within the scope of the appended claims or the equivalents thereof.

What is claimed is:

1. A laser diode device comprising:
 a first light emitting device having a laser structure on a first substrate;
 a second light emitting device having a laser structure on a second substrate;
 a support base; and a columnar conductive part which electrically connects the laser structure side of the second light emitting device and the support base, wherein, the first light emitting device and the second light emitting device are layered in this order on the support base such that the respective laser structures of the first light emitting device and the second light emitting device are opposed to each other, a first substrate side of the first light emitting device and a laser structure side of the second light emitting device are separately electrically connected to the support base, and the opposed laser structures of the first and second light emitting devices are electrically insulated from each other.

2. The laser diode device according to claim 1 further comprising a conductive adhesive layer between the laser structure side of the second light emitting device and the columnar conductive part.

3. The laser diode device according to claim 1, wherein the columnar conductive part extends between the support base and the laser structure side of the second light emitting device.

4. The laser diode device according to claim 1, wherein the support base and the laser structure side of the second light emitting device are electrically connected with the columnar conductive part and the conductive part is between by of (a) a columnar conductive part which electrically connects the laser structure side of the second light emitting device and the support base formed on at least one of the support base and the laser structure side of the second light emitting device and (b) a deformable conductive part formed on the columnar conductive part.

5. The laser diode device according to claim 4 further comprising a conductive adhesive layer between at least one of the support base and the laser structure side of the second light emitting device and the conductive part.

6. The laser diode device according to claim 4, wherein the columnar conductive part and the conductive part have a total height which extends between the support base and the laser structure side of the second light emitting device.

7. The laser diode device according to claim 1, wherein the support base has a groove in a region opposed to the first light emitting device, and a whole or part of the first light emitting device is inserted in the groove.

8. The laser diode device according to claim 7, wherein the groove has a depth with which the support base contacts the first substrate side of the first light emitting device and the laser structure side of the second light emitting device.

9. The laser diode device according to claim 7, wherein the support base and the laser structure side of the second light emitting device are electrically connected with the conductive part in between by a deformable conductive part formed on at least one of the support base and the laser structure side of the second light emitting device.

10. The laser diode device according to claim 9, wherein a conductive adhesive layer is included between at least one of the support base and the laser structure side of the second light emitting device and the conductive part.

11. The laser diode device according to claim 9, wherein the deformable conductive part has a height with which the support base contacts the first substrate side of the first light emitting device and the laser structure side of the second light emitting device.

12. The laser diode device according to claim 1, wherein the first substrate is made of a GaN substrate, and the second substrate is made of a GaAs substrate.

13. The laser diode device according to claim 1, wherein the second light emitting device has a light emitting device made of a gallium arsenic (GaAs) Group III-V compound semiconductor and a light emitting device made of an aluminum gallium indium phosphorus (AlGaInP) Group III-V compound semiconductor.

* * * * *